(12) United States Patent
Hirano

(10) Patent No.: US 6,291,857 B1
(45) Date of Patent: Sep. 18, 2001

(54) SEMICONDUCTOR DEVICE OF SOI STRUCTURE WITH FLOATING BODY REGION

(75) Inventor: Yuuichi Hirano, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/405,051

(22) Filed: Sep. 24, 1999

(30) Foreign Application Priority Data

Apr. 15, 1999 (JP) .................................................. 11-107695

(51) Int. Cl.[7] .................................................. H01L 27/01
(52) U.S. Cl. .......................... 257/350; 257/347; 438/149
(58) Field of Search .................................... 257/347, 350, 257/327, 507, 349; 365/230.06; 438/282, 910, 298, 149

(56) References Cited

U.S. PATENT DOCUMENTS

| | | | |
|---|---|---|---|
| 5,610,533 | * 3/1997 | Arimoto et al. | ........................ 326/33 |
| 5,644,266 | 7/1997 | Chen et al. . | |
| 6,040,610 | * 3/2000 | Noguchi et al. | ...................... 257/392 |

FOREIGN PATENT DOCUMENTS 59-201526  11/1984 (JP) .
10-190435   7/1998 (JP) .

OTHER PUBLICATIONS

Patent Abstracts of Japan, vol. 1995, No. 07, Aug. 31, 1995, JP 07 095032, Apr. 7, 1995.

* cited by examiner

Primary Examiner—Nathan Flynn
Assistant Examiner—Scott R. Wilson
(74) Attorney, Agent, or Firm—Oblon, Spivak, McClelland, Maier & Neustadt, P.C.

(57) ABSTRACT

A semiconductor device having a MOS transistor of SOI structure in which the current driving ability is improved without causing a leakage current, is obtained by providing a NMOS transistor for setting the potential of the body region of a NMOS transistor of a CMOS inverter that receives an input signal outputted from an inverter receiving an input signal via an input terminal, wherein the source of the NMOS transistor is grounded, its gate is connected to the input terminal and its drain is connected to the body region of the NMOS transistor, and the drain potential of the NMOS transistor is a body potential which is the potential of the body region of the NMOS transistor.

12 Claims, 6 Drawing Sheets

US 6,291,857 B1

SEMICONDUCTOR DEVICE OF SOI STRUCTURE WITH FLOATING BODY REGION

BACKGROUND OF THE INVENTION

Field of the Invention

The present invention relates to a semiconductor device of SOI structure with a circuit configuration comprising a MOS transistor.

Description of the Background Art

FIG. 11 is a cross section illustrating the structure of a NMOS transistor having a conventional SOI structure. In the figure, the SOI structure comprises a semiconductor substrate 21, a silicon oxide film 22 and a SOI layer 23, and a NMOS transistor is formed in the SOI layer 23.

Specifically, an N type source region 24 and an N type drain region 25 are selectively formed in the SOI layer 23, the region between the source region 24 and the drain region 25 in the SOI layer 23 becomes a P type body region 26, a gate oxide film 27 is formed on the surface of the body region 26 serving as a channel region, and a gate electrode 28 is formed on the gate oxide film 27.

In the NMOS transistor of the SOI structure as described, when the body region 26 is brought into a floating state, the current driving ability is increased by parasitic bipolar operation. The reason for this is as follows.

Referring to FIG. 11, hole-electron pairs are generated by impact ionization. At this time, in the NMOS transistor, the electrons are extracted by the drain, and the holes are left in the body region 26, thereby increasing the potential of the body region 26. This causes a drop in the threshold voltage of the NMOS transistor having a threshold voltage characteristic as shown in FIG. 12, thereby increasing the current driving ability of the NMOS transistor.

The same is true for PMOS transistors. That is, when hole-electron pairs are generated by impact ionization in a PMOS transistor, the holes are extracted by the drain, and the electrons are left in a body region, thereby decreasing the potential of the body region. This causes a drop in the absolute value of the threshold voltage of the PMOS transistor having a threshold voltage characteristic as shown in FIG. 12, thereby increasing the current driving ability of the PMOS transistor.

Thus the MOS transistor of SOI structure has the advantage that its current driving ability is increased by bringing the body region into a floating state.

The MOS transistor of SOI structure in which the body region is in a floating state is, however, susceptible to the influence of soft error. For example, if in the body region 26 of a MOS transistor, large numbers of hole-electron pairs are generated due to the incidence of α rays into the body region 26, large numbers of holes are to be stored in the body region 26. The NMOS transistor with large numbers of holes stored has no problems in its On-state, but causes a leakage current in its Off state, resulting in an unstable current operation.

Consequently, both merits and demerits arise when the body region of the MOS transistor of SOI structure is brought into a floating state. The body region of the MOS transistor staying in a floating state causes the problem that a leakage current is caused in its Off-state.

SUMMARY OF THE INVENTION

According to a first aspect of the invention, a semiconductor device comprises: a MIS transistor for signal processing formed in a SOI layer of SOI structure, the MIS transistor having (i) a gate that receives a first input signal expressing first/second logic, (ii) a first terminal from which an output signal based on the first input signal is outputted, (iii) a second terminal turning on/off between the first terminal and itself in response to the first/second logic expressed by the first input signal, respectively, and (iv) a body region; and a body region potential shifting means changing a first operation of bringing the body region of the MIS transistor into a floating state, to a second operation of the body region potential shifting toward the second terminal potential, between a first transition in which the first input signal transits from the second logic to the first logic, and a second transition in which the first input signal transits from the first logic expressed by the first input signal in the first transition, to the second logic.

According to a second aspect, the semiconductor device of the first aspect is characterized in that the body region potential shifting means includes a delay means receiving a second input signal and delaying the second input signal to generate the first input signal; and a switching element switching the first operation to the second operation based on the transition of the second input signal.

According to a third aspect, the semiconductor device of the second aspect is characterized in that the switching element has a switching transistor. The switching transistor includes a first terminal connected to the body region of the MIS transistor for signal processing, a second terminal connected to the second terminal of the MIS transistor, and a control terminal receiving the second input signal.

According to a fourth aspect, the semiconductor device of the first aspect further comprises: another MIS transistor for signal processing formed in a SOI layer of SOI structure, the another MIS transistor having (i) a gate that receives the first input signal, (ii) a first terminal connected to the first terminal of the MIS transistor, (iii) a second terminal turning on/off between the first terminal and itself in response to the second/first logic expressed by the first input signal, and (iv) a body region; and another body region potential shifting means changing a first operation of bringing the body region of the another MIS transistor for signal processing into a floating state, to a second operation of the body region potential shifting toward the second terminal potential, between the second transition of the first input signal and the first transition in which the second logic expressed by the first input signal in the second transition transits to the first logic.

According to a fifth aspect, the semiconductor device of the third aspect is characterized in that the MIS transistor for signal processing and the switching transistor are of an identical conductivity type; and the delay means includes a single inverter receiving the second input signal to output the first input signal.

According to a sixth aspect, the semiconductor device of the third aspect is characterized in that the MIS transistor for signal processing and the switching transistor are of an identical conductivity type; and the delay means includes series-connected inverters, the number of which is odd and not less than three, the odd-inverters receiving the second input signal into the first step inverter to output the first input signal from the final step inverter.

In the semiconductor device of the first aspect, when a MIS transistor for signal processing is in On-state by the first transition of a first input signal, its body region is maintained in a floating state, which permits current driving ability to be increased by parasitic bipolar effect. On the other hand, before the MIS transistor transits to Off-state by the second transition of the first input signal, the body region potential shifts toward the second terminal potential, thereby avoiding a leakage current.

In the semiconductor device of the second aspect, since a first input signal is obtained by delaying a second input signal, the transition of the first input signal is generated with a delay time, based on the transition of a second input signal. Thereby, before a MIS transistor for signal processing transits to Off-state, the body potential shifts toward the second terminal potential by switching a first operation to a second operation based on the transition of the second input signal.

In the semiconductor device of the third aspect, the second terminal of a MIS transistor for signal processing has the same potential as its body region, which permits the body region potential shifting toward the second terminal potential.

In the semiconductor device of the fourth aspect, when another MIS transistor for signal processing is in On-state by the second transition of a first input signal, its body region is maintained in a floating state, which permits current driving ability to be increased by parasitic bipolar effect. On the other hand, before the aforesaid MIS transistor transits to Off-state by the first transition of the first input signal, the body region potential shifts toward the second terminal potential, thereby avoiding a leakage current.

In the semiconductor device of the fifth aspect, a second input signal can be given a delay by the amount of a predetermined signal propagation delay time of a single inverter, to output a first input signal of the reverse logic.

Hence, over almost all period that a MIS transistor for signal processing is brought into On-state by the first input signal, a switching transistor is brought into Off-state by a second input signal so that the body region is maintained in a floating state. Thereby, the switching transistor becomes On-state to enable the body region potential to be shifted toward the second terminal potential, before the MIS transistor transits to Off-state by the first input signal.

In the semiconductor device of the sixth aspect, a first input signal is outputted from the final step inverter. It is therefore possible to output the first input signal of the reverse logic, with a delay by the amount of a predetermined signal propagation time of the overall odd-inverters.

Hence, over almost all period that a MIS transistor for signal processing is brought into On-state by the first input signal, a switching transistor is brought into Off-state by a second input signal so that the body region is maintained in a floating state. Thereby, the switching transistor becomes On-state to enable the body region potential to be shifted toward the second terminal potential, before the MIS transistor transits to Off-state by the first input signal.

In addition, the number of the odd-inverter is not less than three, thereby making it easy to give the second input signal a large delay time.

It is therefore an object of the present invention to provide a semiconductor device having a MIS transistor of SOI structure in which the current driving ability is improved without causing a leakage current.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings.

DESCRIPTION OF THE PREFERRED EMBODIMENTS

Principle of the Invention

It is considered to be ideal that in Off-state of a MOS transistor of SOI structure causing a leakage current, the body region has a fixed potential at which body potential shifts toward a source potential, instead of being in a floating state, and the body region is brought into a floating state in its On-state.

Figure 9:
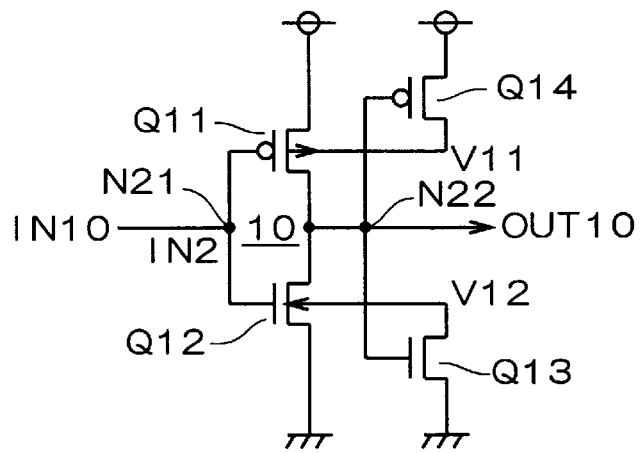
FIG. 9 is a circuit diagram of a circuit configuration of a semiconductor device based on the principle of the present invention.

FIG. 9 shows a circuit configuration of a semiconductor device based on the above consideration. In FIG. 9, a CMOS inverter 10 comprises a PMOS transistor Q11 and a NMOS transistor Q12 which are provided in series between a power supply and ground level. The CMOS inverter 10 receives an input signal IN10 at an input terminal N21 (the gates of the transistors Q11 and Q12), and outputs an output signal OUT10 from an output terminal N22 (the drains of the transistors Q11 and Q12).

A NMOS transistor Q13 and PMOS transistor Q14 are added which set a fixed potential and set and control a floating of each body region of the PMOS transistor Q11 and NMOS transistor Q12 of the CMOS inverter 10 as described.

The source of the NMOS transistor Q13 is grounded, its gate is connected to the output terminal N22, and its drain is connected to the body region of the NMOS transistor Q12. On the other hand, the source of the PMOS transistor Q14 is connected to the power supply, its gate is connected to the output terminal N22, and its drain is connected to the body region of the PMOS transistor Q11. Thereby, the drain potential of the PMOS transistor Q14 becomes a body potential V11 which is the potential of the body region of the PMOS transistor Q11, and the drain potential of the NMOS transistor Q13 is a body potential V12 which is the potential of the body region of the NMOS transistor Q12.

Figure 11:
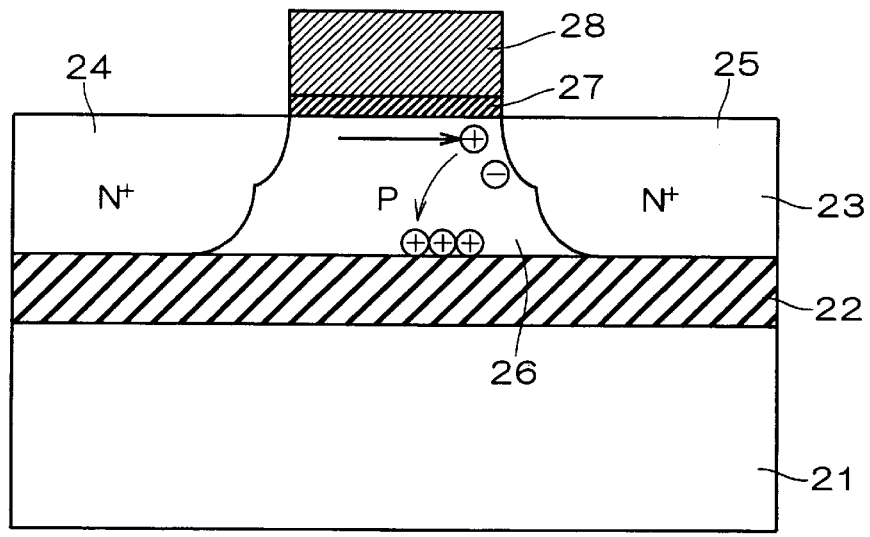
FIG. 11 is a cross section illustrating a NMOS transistor of SOI structure in prior art.
Figure 12:
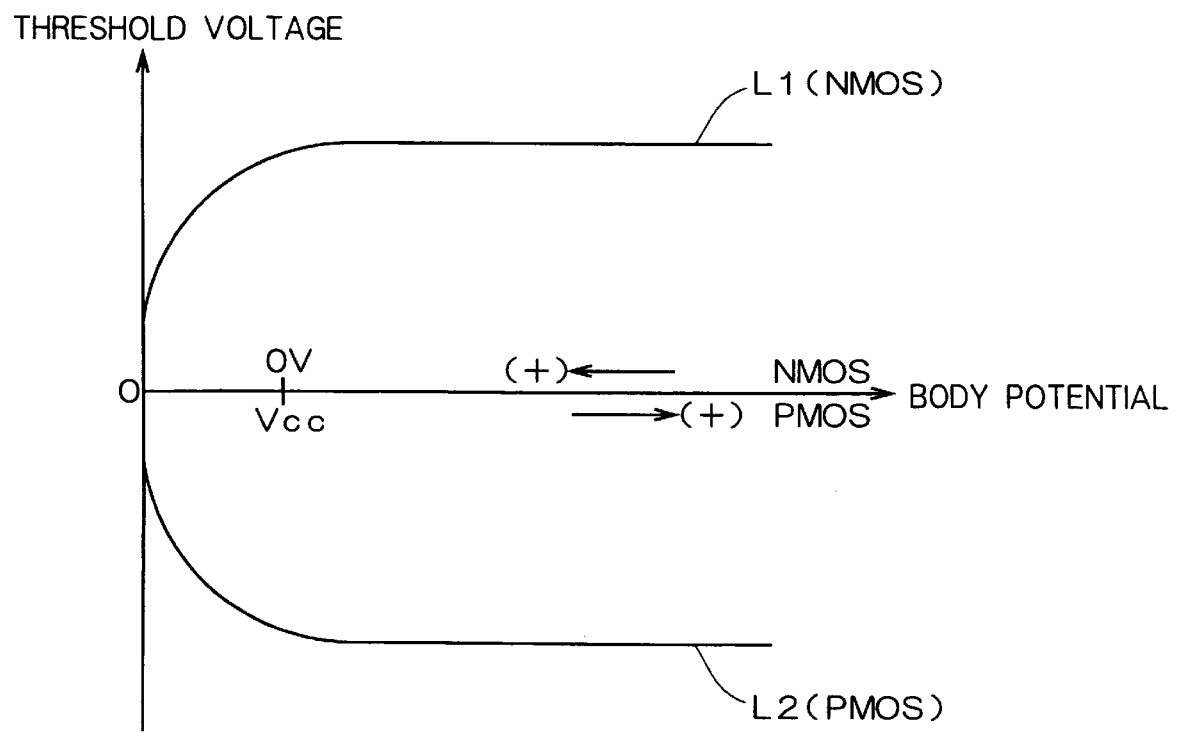
FIG. 12 is a graph showing the relationship between the potential of the body region of a MOS transistor and the threshold voltage in prior art.

The PMOS transistor Q11 and the NMOS transistor Q12 are respectively formed such as to have the structure as shown in FIG. 11, in N type and P type semiconductor forming regions isolated in a SOI layer.

Figure 10:
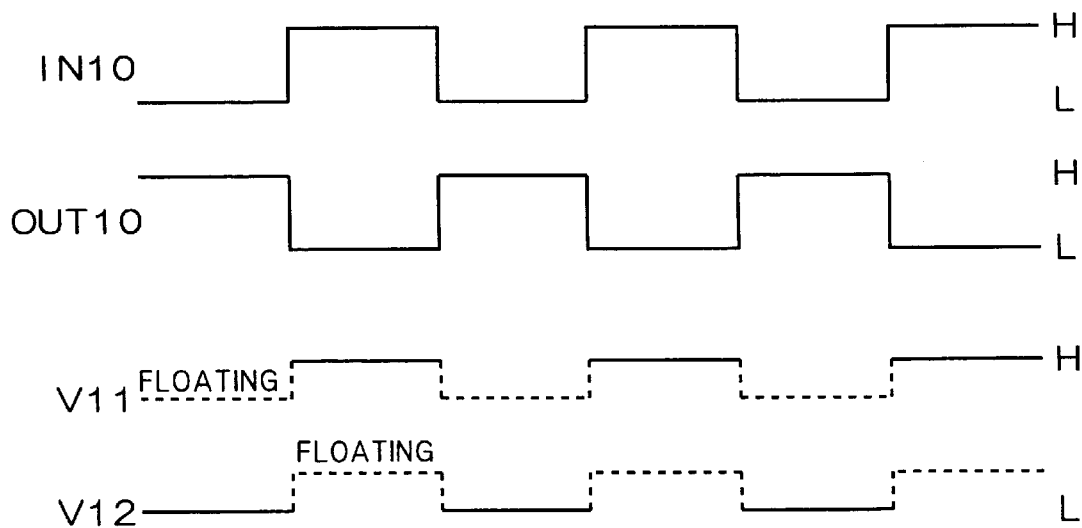
FIG. 10 is a timing chart illustrating operation of the circuit of FIG. 9.

FIG. 10 is a timing chart illustrating operation of the circuit of FIG. 9. As shown in FIG. 10, when an input signal IN10 of "H" (power supply voltage) or "L" (ground level) is generated at a predetermined frequency, an output signal OUT10 is also generated based on the reverse logic to the input signal IN10, at the predetermined frequency.

Since the PMOS transistor Q14 is turned on or off, based on the output signal OUT10, the body potential V11 of the PMOS transistor Q11 becomes "H" when the input signal IN10 is "H" (the output signal OUT10 is "L"), and it is brought into a floating state when the input signal IN10 is "L" (the output signal OUT10 is "H").

The body region is not affected by soft error because its potential is fixed at the power supply potential when the PMOS transistor Q11 is in Off-state. In On-state the body region is set to a floating state so that the absolute value of the threshold voltage is decreased as previously described, thereby increasing the current driving ability.

Since the NMOS transistor Q13 is turned on or off, based on the output signal OUT10, the body potential V12 of the NMOS transistor Q12 is brought into a floating state when the input signal IN10 is "H" (the output signal OUT10 is "L"), and it becomes "L" when the input signal IN10 is "L" (the output signal OUTIO is "H").

The body region is not affected by soft error because its potential is fixed at the ground level when the NMOS transistor Q12 is in Off-state. In On-state the body region is set to a floating state so that the absolute value of the threshold voltage is decreased as previously described, thereby increasing the current driving ability.

Accordingly, the circuit configuration of FIG. 9 is effective in solving the prior art problem, however, this circuit configuration has the following problems.

In the circuit of FIG. 9, when the NMOS transistor Q12 is in On-state, the body potential V12 is in a floating state and holes are stored in the body region, resulting in a drop in the threshold voltage of the NMOS transistor Q12. Therefore, a leakage current passes through the NMOS transistor Q12 when the input signal IN10 is changed from "H" to "L", namely, when it falls to "L". The leakage current continues to flow until the holes stored in the body region of the NMOS transistor Q12 are sufficiently extracted by the ground level, after the input signal IN10 becomes "L", the output signal OUT10 becomes "H", and the body potential V12 becomes "L".

The same is true for the PMOS transistor Q11. That is, in the circuit of FIG. 9, when the PMOS transistor Q11 is in On-state, the body potential V11 is in a floating state and electrons are stored in the body region, resulting in a drop in the absolute value of the threshold voltage of the PMOS transistor Q11. Therefore, a leakage current passes through the PMOS transistor Q11 when the input signal IN10 is changed from "L" to "H", namely when it rises to "H". The leakage current continues to flow until the electrons stored in the body region of the PMOS transistor Q11 are sufficiently extracted by the power supply, after the input signal IN10 becomes "H", the output signal OUT10 becomes "L", and the body potential V11 becomes "H".

Even in the circuit of FIG. 9, when the PMOS transistor Q11 and NMOS transistor Q13 rise to "H" and fall to "L", respectively, a turn-off operation cannot be performed rapidly, resulting in poor response characteristic of the CMOS inverter 10.

The following preferred embodiments aim to improve current driving ability without adverse effect of soft error, and also improve the circuit response characteristic.

First Preferred Embodiment

Figure 1:
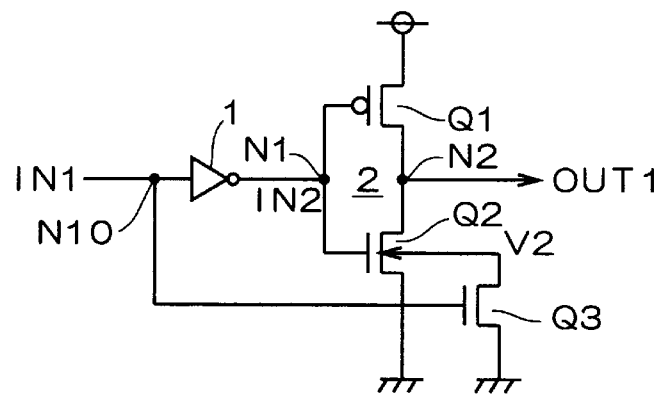
FIG. 1 is a circuit diagram illustrating a circuit configuration of a semiconductor device according to a first preferred embodiment of the present invention.

FIG. 1 is a circuit diagram illustrating a circuit configuration of a semiconductor device according to a first preferred embodiment of the invention. In FIG. 1, a CMOS inverter 2 comprises a PMOS transistor Q11 and a NMOS transistor Q2 which are provided in series between a power supply and ground level. The CMOS inverter 2 receives an input signal IN2 at an input terminal N1 (the gates of the transistors Q11 and Q2), and outputs an output signal OUT1 from an output terminal N2 (the drains of the transistors Q1 and Q2). The input signal IN2 is outputted from an inverter 1 that receives an input signal IN1 via an input terminal N10.

A NMOS transistor Q3 sets a fixed potential and also sets and controls floating of the body region of the NMOS transistor Q2 in the CMOS inverter 2 as described.

The source of the NMOS transistor Q3 is grounded, its gate is connected to the input terminal N10, and its drain is connected to the body region of the NMOS transistor Q2. Thereby, the drain potential of the NMOS transistor Q3 is a body potential V2 which is the potential of the body region of the NMOS transistor Q2.

Hereat, a signal propagation delay time that is the time interval between input and output of the inverter 1 (i.e., input signals IN1 and IN2) is set to ΔT1, and a signal propagation delay time that is the time interval between the input signal IN2 and output signal OUT1 of the CMOS inverter 2 is set to ΔT2. The signal propagation delay time ΔT1 is set to not less than the threshold voltage recovery time, through which period the holes stored in the body region of the NMOS transistor Q2 when the body region is in a floating state, are extracted to the ground level by the NMOS transistor Q3, and the threshold voltage of the NMOS transistor Q2 is recovered sufficiently to the level of Off stationary state.

In the above construction, at least the MOS transistors Q1 and Q2 are a MOS transistor of SOI structure, and the PMOS transistor Q1 and the NMOS transistor Q2 are respectively formed in N type and P type semiconductor forming regions isolated with each other in a SOI layer, such as to have the structure shown in FIG. 11.

Figure 2:
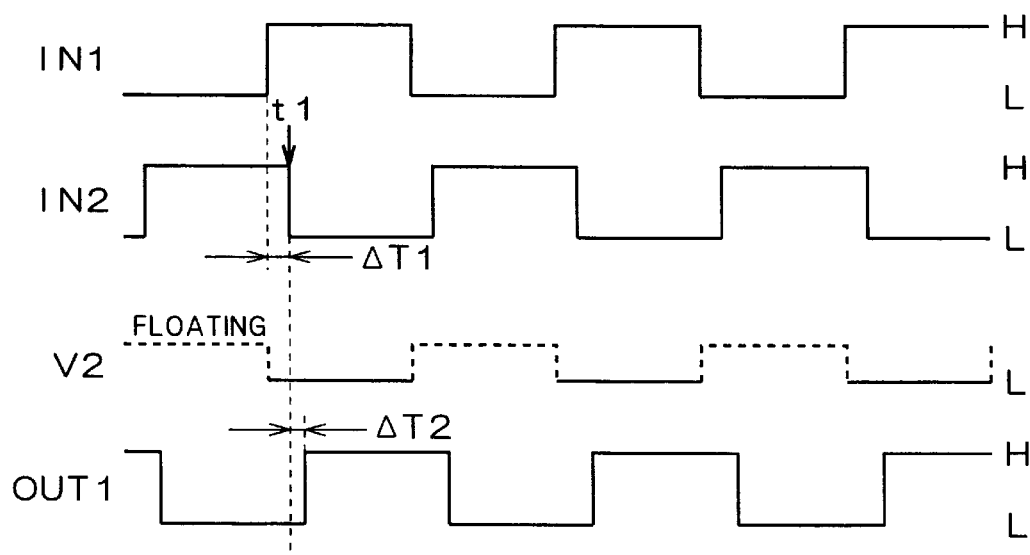
FIG. 2 is a timing chart illustrating operation of the first preferred embodiment.

FIG. 2 is a timing chart illustrating operation of the circuit of FIG. 1 in the first preferred embodiment. As shown in FIG. 2, when an input signal IN1 of "H" or "L" is generated at a predetermined frequency, and an input signal IN2 is generated based on the reverse logic to the input signal IN1, with a signal propagation delay time ΔT1 of the inverter 1. With a signal propagation delay time ΔT2 from the generation of the input signal IN2, an output signal OUT1 is generated based on the reverse logic to the input signal IN2.

A NMOS transistor Q3 is turned on/off based on "H"/"L" of the input signal IN1. A body potential V2 of a NMOS transistor Q2 is brought into a floating state when the input signal IN1 is "L", and it becomes "L" when the input signal N1 is "H".

By setting the signal propagation delay time ΔT1 such as to be not less than the threshold voltage recovery time and sufficiently smaller than the transmission period of the input signal IN1 (e.g., about one-tenth of the transmission period), the potential of the body region is fixed over almost all period of Off-state of the NMOS transistor Q2, thereby the body region is not affected by soft error. Also, since the body region is brought into a floating state over almost all period of On-state, the threshold voltage is lowered and thus enables to increase the current driving ability.

In addition, the NMOS transistor Q3 is turned on or off, based on the input signal IN1 of which edge change is caused earlier than that of the input signal IN2 by the amount of time ΔT1. Therefore, it has already started to fix the potential of the ground level of the body region in the NMOS transistor Q2, prior to time ΔT1 from time t1 at which the input signal IN2 is changed from "H" to "L", namely, it falls to "L". Thereby, the body potential shifts toward the source potential before the input signal IN2 falls to "L", and thus the threshold voltage of the NMOS transistor Q2 is recovered sufficiently to Off stationary state when the input signal IN2 falls to "L".

As a result, no leakage current flows when the NMOS transistor Q2 is turned off. This permits a quick turn-off operation of the transistor Q2.

Thus in the semiconductor device of the first preferred embodiment, an improvement in response characteristic of the CMOS inverter 2 is achieved, taking advantage of that the turn-off operation of the NMOS transistor Q2 constituting the CMOS inverter 2 is improved by disposing the NMOS transistor Q3 turning on or off, based on the input signal IN1 which performs the transfer of information earlier than the input signal IN2 of the CMOS inverter 2, in order to control the potential of the body region of the NMOS transistor Q2.

Second Preferred Embodiment

Figure 3:
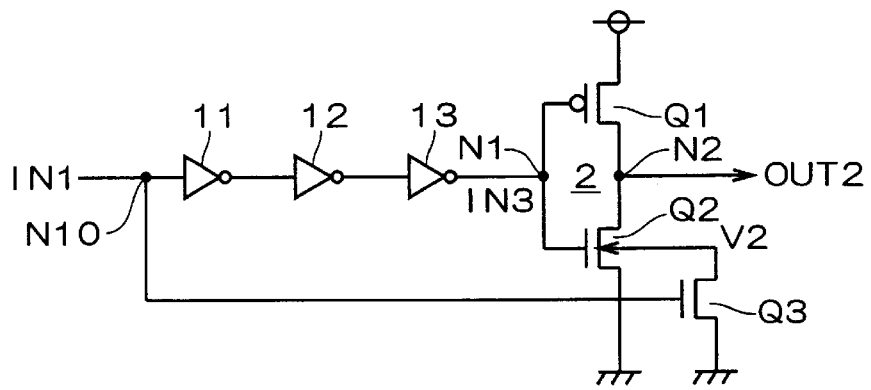
FIG. 3 is a circuit diagram illustrating a circuit configuration of a semiconductor device according to a second preferred embodiment.

FIG. 3 is a circuit diagram illustrating a circuit configuration of a semiconductor device according to a second preferred embodiment. As shown in FIG. 3, a CMOS inverter 2 having the same configuration of the first preferred embodiment receives an input signal IN3 at an input terminal N1 and outputs an output signal OUT2 from an output terminal N2. The input signal IN3 is outputted from three series-connected inverters 11 to 13 which receive an input signal IN1 via an input terminal N10. As in the case with the first preferred embodiment, a NMOS transistor Q3 of which gate is connected to the input terminal N10 is provided for controlling the potential of the body region of a NMOS transistor Q2.

Here, a signal propagation delay time that is the time interval between input and output of the three series-connected inverters 11 to 13 is set to ΔT3, and a signal propagation delay time that is the time interval between input and output of the CMOS inverter 2 is set to ΔT2. A signal propagation delay time ΔT3 is set to not less than the threshold voltage recovery time, as in the first preferred embodiment.

Figure 4:
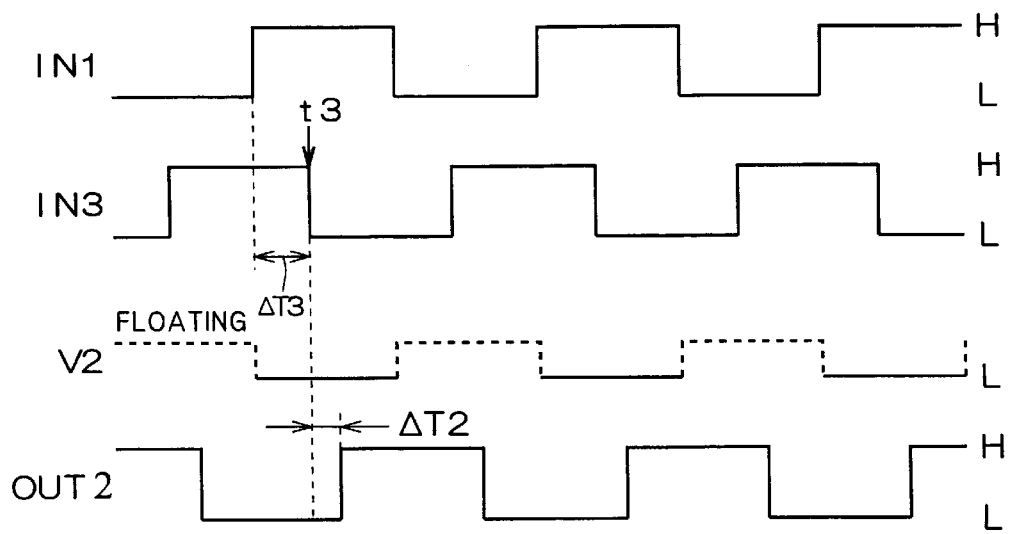
FIG. 4 is a timing chart illustrating operation of the second preferred embodiment.

FIG. 4 is a timing chart illustrating operation of the circuit of FIG. 3 in the second preferred embodiment. As shown in FIG. 4, when an input signal IN1 is generated at a predetermined frequency, an input signal IN3 is generated based on the reverse logic to the input signal IN1, with a signal propagation delay time ΔT3 of the inverter 1. With a signal propagation delay time ΔT2 from the generation of the input signal IN3, an output signal OUT2 is generated based on the reverse logic to the input signal IN3.

The NMOS transistor Q3 is turned on/off based on "H"/"L" of the input signal IN1. A body potential V2 of the NMOS transistor Q2 is brought into a floating state when the input signal IN1 is "L", and it becomes "L" when the input signal IN1 is "H".

Like the first preferred embodiment, by setting the signal propagation delay time ΔT3 to not less than the threshold voltage recovery time and sufficiently smaller than the transmission period of the input signal IN1, the potential of the body region is fixed over almost all period of Off-state of the NMOS transistor Q2, and hence it is not affected by soft error. Also, since the body region is brought into a floating state over almost all period of On-state, the threshold voltage is lowered which permits an increase in current driving ability.

In addition, the NMOS transistor Q3 is turned on or off, based on the input signal IN1 of which edge change is caused earlier than that of the input signal IN3 by the amount of time ΔT3. Thus it has already started to fix the potential of the body region of the NMOS transistor Q2, prior to time ΔT3 from time t3 at which the input signal IN3 falls to "L". Thereby, the body potential shifts toward the source potential before the input signal IN3 falls to "L", and hence the threshold voltage of the NMOS transistor Q2 is recovered sufficiently to Off stationary state when the input signal IN3 falls to "L".

At this time, because the sum of the signal propagation delay time of the three inverters 11 to 13 becomes the delay time ΔT3, it is easy to set a delay time greater than the delay time ΔT1 in the first preferred embodiment, and set the delay time ΔT3 such as to be greater than the threshold voltage recovery time.

As a result, no leakage current flows when the NMOS transistor Q2 is turned off. This permits a quick turn-off operation of the transistor Q2.

Thus in the semiconductor device of the second preferred embodiment, an improvement in response characteristic of the CMOS inverter 2 is achieved, taking advantage of that the turn-off operation of the NMOS transistor Q2 constituting the CMOS inverter 2 is improved reliably by disposing the NMOS transistor Q3 turning on/off based on the input signal IN1 which performs the transfer of information earlier than the input signal IN3 of the CMOS inverter 2, in order to control the potential of the body region of the NMOS transistor Q2.

Third Preferred Embodiment

Figure 5:
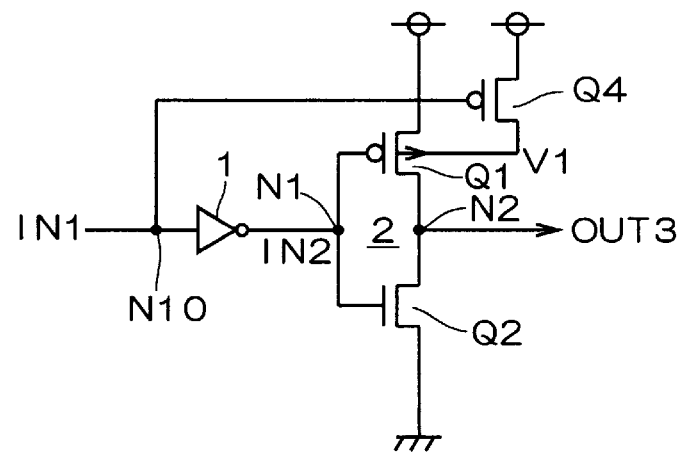
FIG. 5 is a circuit diagram illustrating a circuit configuration of a semiconductor device according to a third preferred embodiment.

FIG. 5 is a circuit diagram illustrating a circuit configuration of a semiconductor device according to a third preferred embodiment. In FIG. 5, a CMOS inverter 2 having the same construction as the first preferred embodiment receives an input signal IN2 at an input terminal N1 and outputs an output signal OUT2 from an output terminal N2. The input signal IN2 is outputted from an inverter 1 that receives an input signal N1 via an input terminal N10.

A PMOS transistor Q4 sets a fixed potential and also sets and controls floating of the body region of the PMOS transistor Q1 in the CMOS inverter 2 as described.

The source of the PMOS transistor Q4 is connected to the power supply, its gate is connected to the input terminal N10, and its drain is connected to the body region of the PMOS transistor Q1. Thereby, the drain potential of the PMOS transistor Q4 is a body potential V1 which is the potential of the body region of the PMOS transistor Q1.

Hereat, a signal propagation delay time that is the time interval between input and output of the inverter 1 is set to ΔT1, and a signal propagation delay time that is the time interval between input and output of the CMOS inverter 2 is set to ΔT2. The signal propagation delay time ΔT1 is set to not less than the threshold voltage recovery time, as in the case with the first preferred embodiment.

Figure 6:
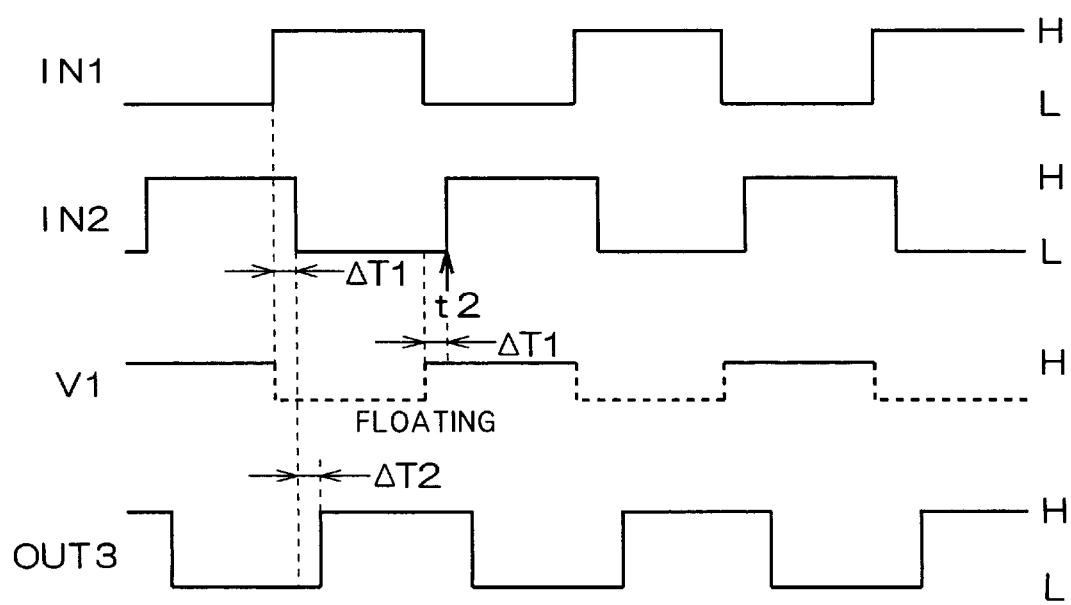
FIG. 6 is a timing chart illustrating operation of the third preferred embodiment.

FIG. 6 is a timing chart illustrating operation of the circuit of FIG. 5 in the third preferred embodiment. As shown in FIG. 6, when an input signal IN1 is generated at a predetermined frequency, an input signal IN2 is generated based on the reverse logic to the input signal IN1, with a signal propagation delay time ΔT1 of the inverter 1. With a signal propagation delay time ΔT2 from the generation of the input signal IN2, an output signal OUT2 is generated based on the reverse logic to the input signal IN2.

The PMOS transistor Q4 is turned on/off based on "H"/"L" of the input signal IN1. A body potential V1 of the PMOS transistor Q1 becomes "H" when the input signal IN1 is "L", and it is brought into a floating state when the input signal IN1 is "H".

As in the first preferred embodiment, by setting the signal propagation delay time ΔT1 to not less than the threshold voltage recovery time and sufficiently smaller than the transmission period of the input signal IN1, the potential of the body region is fixed over almost all period of Off-state of the PMOS transistor Q1, and hence it is not affected by soft error. Also, since the body region is brought into a floating state over almost all period of On-state, the absolute value of the threshold voltage is lowered which permits an increase in current driving ability.

In addition, the PMOS transistor Q4 is turned on or off, based on the input signal IN1 of which edge change is caused earlier than that of the input signal IN2 by the amount of time ΔT1. Thus it has already started to fix the potential of the body region of the PMOS transistor Q1, prior to time ΔT1 from time t2 at which the input signal IN2 is changed from "L" to "H", namely, it rises to "H". Thereby, the body potential shifts toward the source potential before the input signal IN2 rises "H", and hence the absolute value of the threshold voltage is recovered sufficiently to the Off stationary state of the PMOS transistor Q1 when the input signal IN2 rises to "H".

As a result, no leakage current flows when the PMOS transistor Q1 is turned off. This permits a quick turn-off operation of the transistor Q1.

Thus in the semiconductor device of the third preferred embodiment, an improvement in response characteristic of the CMOS inverter 2 is achieved, taking advantage of that the turn-off operation of the PMOS transistor Q1 constituting the CMOS inverter 2 is improved by disposing the PMOS transistor Q4 turning on or off, based on the input signal IN1 which performs the transfer of information earlier than the input signal IN2 of the CMOS inverter 2, in order to control the potential of the body region of the PMOS transistor Q1.

Although in the first preferred embodiment a single inverter 1 is used as a delay means, three series-connected inverters 11 to 13 as in the second preferred embodiment may be used instead of the inverter 1, such as to supply an input signal IN3 to the input terminal of the CMOS inverter 2.

Fourth Preferred Embodiment

Figure 7:
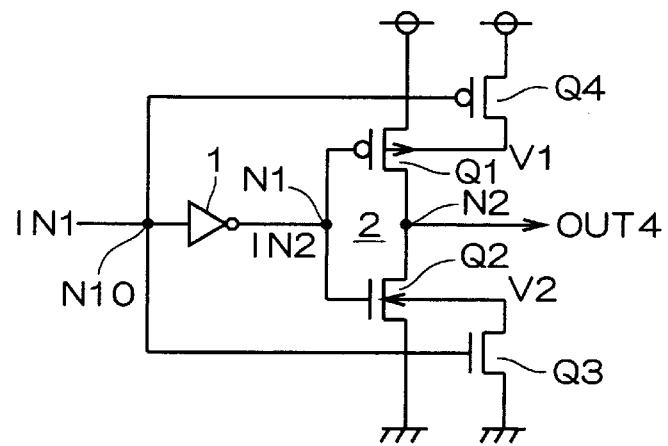
FIG. 7 is a circuit diagram illustrating a circuit configuration of a semiconductor device according to a fourth preferred embodiment.

FIG. 7 is a circuit diagram illustrating a circuit configuration of a semiconductor device according to a fourth preferred embodiment. As shown in FIG. 7, a CMOS inverter 2 having the same configuration of the first preferred embodiment receives an input signal IN2 at an input terminal N1 and outputs an output signal OUT4 from an output terminal N2. The input signal IN2 is outputted from an inverter 1 which receives an input signal IN1 via an input terminal N10.

The same NMOS transistor Q3 as in the first and second preferred embodiments and the same PMOS transistor Q4 as in the third preferred embodiment are provided in order to control the potential of the body region of a PMOS transistor Q1 and a NMOS transistor Q2 of the CMOS inverter 2 as described. Therefore, the drain potential of the PMOS transistor Q4 is a body potential V1 of the PMOS transistor Q1, and the drain potential of the NMOS transistor Q3 becomes a body potential V2 of the NMOS transistor Q2.

Hereat, a signal propagation delay time that is the time interval between input and output of the inverter 1 is set to ΔT1, and a signal propagation delay time that is the time interval between input and output of the CMOS inverter 2 is set to ΔT2. The signal propagation delay time ΔT1 is set to not less than the threshold voltage recovery time, through which period the body potential when the body regions of the PMOS transistor Q1 and the NMOS transistor Q2 are in a floating state, shifts toward the source potential and ground level via the PMOS transistor Q4 and the NMOS transistor Q3, respectively, and the absolute value of the threshold voltage of the PMOS transistor Q1 and the NMOS transistor Q2 can be recovered sufficiently in Off stationary state.

Figure 8:
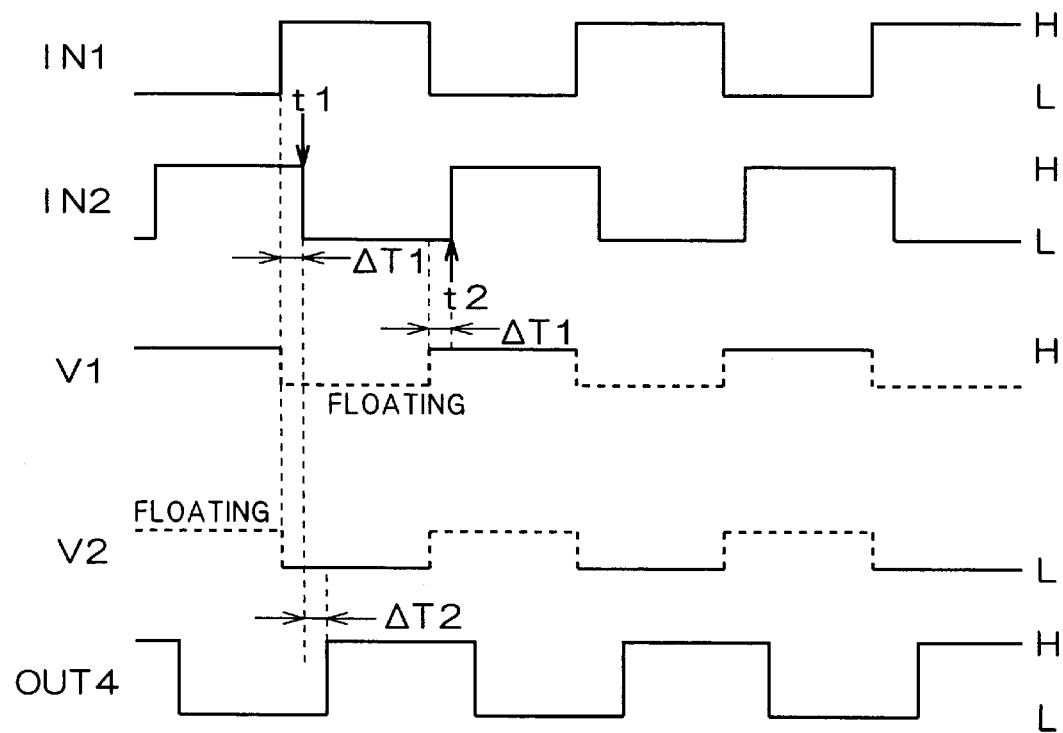
FIG. 8 is a timing chart illustrating operation of the fourth preferred embodiment.

FIG. 8 is a timing chart illustrating operation of a semiconductor device of the fourth preferred embodiment. As shown in FIG. 8, when an input signal IN1 is generated at a predetermined frequency, an input signal IN2 is generated based on the reverse logic to the input signal IN1, with a signal propagation delay time ΔT1 of the inverter 1. With a signal propagation delay time ΔT2 from the generation of the input signal IN2, an output signal OUT4 is generated based on the reverse logic to the input signal IN2.

The NMOS transistor Q3 is turned on/off based on "H"/"L" of the input signal IN1. A body potential V2 of the NMOS transistor Q2 is brought into a floating state when the input signal IN1 is "L", and it becomes "L" when the input signal IN1 is "H".

Like the first preferred embodiment, by setting the signal propagation delay time ΔT1 to not less than the threshold voltage recovery time and sufficiently smaller than the transmission period of the input signal IN1, the potential of the body region is fixed over almost all period of Off-state of the NMOS transistor Q2, and hence it is not affected by soft error. Also, since the body region is brought into a floating state over almost all period of On-state, the threshold voltage is lowered which permits an increase in current driving ability.

In addition, as in the first preferred embodiment, it has already started to fix the potential of the body region of the NMOS transistor Q2, prior to time ΔT1 from time t2 at which the input signal IN2 falls to "L". Thereby, the threshold voltage of the NMOS transistor Q2 is recovered sufficiently to Off stationary state when the input signal IN2 falls to "L".

As a result, no leakage current flows when the NMOS transistor Q2 is turned off. This permits a quick turn-off operation of the transistor Q2.

Since the PMOS transistor Q4 is turned on/off based on "L"/"H" of the input signal IN1, a body potential V1 of the PMOS transistor Q1 becomes "H" when the input signal IN1 is "L", and it is brought into a floating state when the input signal IN1 is "H".

Accordingly, the potential of the body region is fixed over almost all period of Off-state of the PMOS transistor Q1, and hence it is not affected by soft error. Since the body region is brought into a floating state over almost all period of On-state, the absolute value of the threshold voltage is lowered which permits an increase in current driving ability.

In addition, as in the third preferred embodiment, it has already started to fix the potential of the body region of the PMOS transistor Q1, prior to time ΔT1 from time t2 at which the input signal IN2 rises to "H". Thereby, the absolute value of the threshold voltage of the PMOS transistor Q1 is recovered sufficiently to Off stationary state when the input signal IN2 rises to "H".

As a result, no leakage current flows when the PMOS transistor Q1 is turned off. This permits a quick turn-off operation of the transistor Q1.

Thus in the semiconductor device of the fourth preferred embodiment, an improvement in response characteristic of the CMOS inverter 2 is achieved, taking advantage of that each turn-off operation of the PMOS transistor Q1 and the NMOS transistor Q2 constituting the CMOS inverter 2 is improved by disposing the MOS transistors Q3 and Q4 turning on or off, based on the input signal IN1 which performs the transfer of information earlier than the input signal IN2 of the CMOS inverter 2, in order to control the potential of the body regions of the MOS transistors Q1 and Q2, respectively.

Although in the fourth preferred embodiment a single inverter 1 is used as a delay means, three series-connected inverters 11 to 13 as in the second preferred embodiment may be used instead of the inverter 1, such as to supply an input signal IN3 to the input terminal of the CMOS inverter 2.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a first MOS transistor for signal processing formed in a SOI layer of SOI structure, said first MOS transistor having (i) a gate that receives a first input signal expressing first/second logic, (ii) a first terminal from which an output signal based on said first input signal is outputted, (iii) a second terminal turning on/off in response to said first/second logic expressed by said first input signal, respectively, and (iv) a body region; and a first body region potential shifting means changing a first operation of bringing said body region of said first MOS transistor into a floating state, to a second operation of said body region potential shifting toward said second terminal potential, between a first transition in which said first input signal transitions from said second logic to said first logic, and a second transition in which said first input signal transitions from said first logic expressed by said first input signal in said first transition, to said second logic.

2. A semiconductor device according to claim 1 wherein said first body region potential shifting means includes:

a delay means receiving a second input signal and delaying said second input signal to generate said first input signal; and a switching element switching said first operation to said second operation based on the transition of said second input signal.

3. A semiconductor device according to claim 2 wherein said switching element includes a switching transistor, said switching transistor including:

a first switching terminal connected to said body region of said first MOS transistor for signal processing; and a switching control terminal receiving said second input signal.

4. A semiconductor device according to claim 3 wherein the conductivity type of said first MOS transistor for signal processing and said switching transistor includes N type.

5. A semiconductor device according to claim 3 wherein the conductivity type of said first MOS transistor for signal processing and said switching transistor includes P type.

6. A semiconductor device according to claim 1 further comprising:

a second MOS transistor for signal processing formed in a SOI layer of SOI structure, said second MOS transistor having (i) a gate that receives said first input signal, (ii) a first terminal connected to said first terminal of said first MOS transistor, (iii) a second terminal turning on/off in response to said second/first logic expressed by said first input signal, and (iv) a body region; and a second body region potential shifting means changing a first operation of bringing said body region of said second MOS transistor for signal processing into a floating state, to a second operation of said body region potential of said second MOS transistor shifting toward said second terminal potential, between said second transition of said first input signal and said first transition in which said second logic expressed by said first input signal in said second transition transits to said first logic.

7. A semiconductor device according to claim 6, wherein said first body region potential shifting means includes:

a delay means receiving a second input signal and delaying said second input signal to generate said first input signal; and a first switching element switching said first operation to said second operation based on the transition of said second input signal; and wherein said second body region potential shifting means includes:

said delay means in common with said first body region potential shifting means; and a second switching element switching said first operation to said second operation based on the transition of said second input signal.

8. A semiconductor device according to claim 7, wherein said first switching element includes a first switching transistor, said first switching transistor including:

a first switching terminal connected to said body region of said first MOS transistor for signal processing; and a switching control terminal receiving said second input signal; and wherein said second switching element includes a second switching transistor, said second switching transistor including:

a first switching terminal connected to said body region of said second MOS transistor for signal processing;

a second switching terminal connected to said second terminal of said second MOS transistor; and a switching control terminal receiving said second input signal.

9. A semiconductor device according to claim 8 wherein, said first MOS transistor for signal processing includes a first MOS transistor of a first conductivity type;

said second MOS transistor for signal processing includes a second MOS transistor of a second conductivity type;

said first switching transistor includes a third MOS transistor of the first conductivity type; and said second switching transistor includes a fourth MOS transistor of the second conductivity type.

10. A semiconductor device according to claim 9 wherein said first conductivity type is N type, and said second conductivity type is P type.

11. A semiconductor device according to claim 3 wherein, said first MOS transistor for signal processing and said switching transistor are of an identical conductivity type; and said delay means includes a single inverter receiving said second input signal to output said first input signal.

12. A semiconductor device according to claim 3 wherein, said first MOS transistor for signal processing and said switching transistor are of an identical conductivity type; and said delay means includes series-connected inverters, the number of which is odd and not less than three, said odd-inverters receiving said second input signal into the first step inverter to output said first input signal from the final step inverter.

* * * * *